United States Patent [19]
Suzuki

[11] Patent Number: 5,643,808
[45] Date of Patent: Jul. 1, 1997

[54] PROCESS OF MANUFACTURING A SEMICONDUCTOR DEVICE

[75] Inventor: Hisamitsu Suzuki, Tokyo, Japan

[73] Assignee: NEC Corporation, Tokyo, Japan

[21] Appl. No.: 535,892

[22] Filed: Sep. 28, 1995

Related U.S. Application Data

[62] Division of Ser. No. 355,327, Dec. 12, 1994, abandoned.

[30] Foreign Application Priority Data

Dec. 15, 1993 [JP] Japan .................................. 5-314641

[51] Int. Cl.$^6$ ............................................... H01L 21/265
[52] U.S. Cl. ........................... 437/31; 437/26; 437/27; 437/149; 437/154
[58] Field of Search ............................... 437/31, 59, 32, 437/26, 27, 149, 154

[56] References Cited

U.S. PATENT DOCUMENTS

| | | | |
|---|---|---|---|
| 4,868,135 | 9/1989 | Ogura et al. | |
| 4,996,581 | 2/1991 | Hamasaki | 437/31 |
| 5,010,026 | 4/1991 | Gomi | 437/31 |
| 5,015,594 | 5/1991 | Chu et al. | 437/31 |
| 5,183,768 | 2/1993 | Kameyama et al. | 437/31 |
| 5,208,171 | 5/1993 | Ohmi | 437/31 |
| 5,455,189 | 10/1995 | Grubisich | 437/59 |

*Primary Examiner*—Tuan H. Nguyen
*Attorney, Agent, or Firm*—Sughrue, Mion, Zinn, Macpeak & Seas

[57] ABSTRACT

A method of manufacturing wherein an NPN bipolar transistor, an N-type impurity region is formed in an N-type epitaxial region or an N-type well region between an N$^+$-buried layer region and a P-type intrinsic base region. The N-type impurity region is formed only just below the P-type intrinsic base region. The impurity concentration of the N-type impurity region is either uniform or is higher at a central portion of the region located just below an emitter diffused region than the impurity concentration at the surrounding the central portion.

4 Claims, 8 Drawing Sheets

FIG. 11(a)
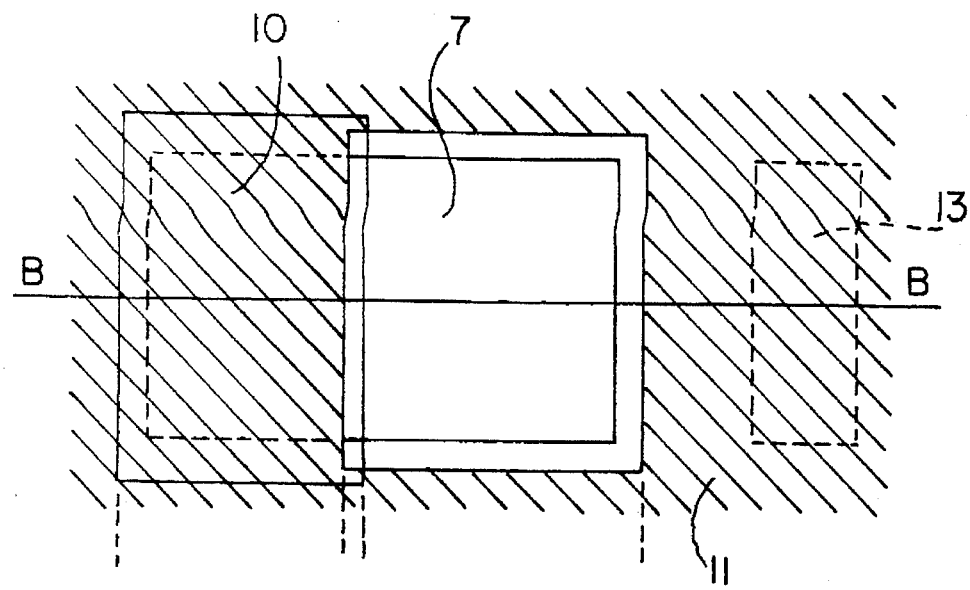
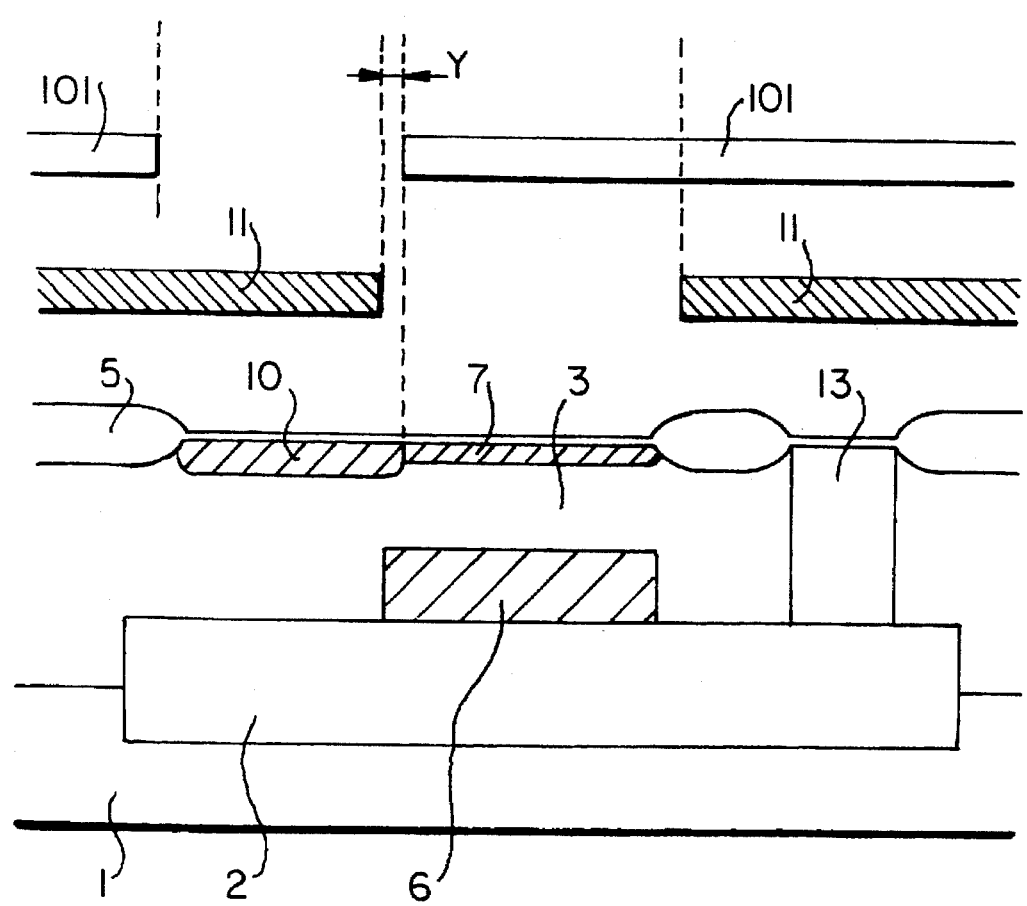
FIG. 11(b)

PROCESS OF MANUFACTURING A SEMICONDUCTOR DEVICE

This is a divisional of U.S. patent application Ser. No. 08/355,327, filed Dec. 12, 1994, now abandoned.

BACKGROUND OF THE INVENTION

1. Field of the Invention

This invention relates to a bipolar semiconductor integrated circuit device and a process of manufacturing the same, and more particularly to the structure of an NPN bipolar transistor and a process of manufacturing the same.

2. Description of the Prior Art

Conventionally, the high speed operation and high driving capacity of a bipolar transistor is achieved by two methods.

According to the first method, parasitic resistances of electrodes and diffused layers of an emitter, base and collector and parasitic capacitances between the electrodes and at junctions of diffused layers of the emitter, base and collector are minimized.

According to the second method, a cut-off frequency fT is improved. The second method is achieved by reducing the depth of the base diffused layer to reduce the base width and improve the cut-off frequency fT, or by providing, for example, in an NPN bipolar transistor, an N-type impurity area having an impurity concentration higher than the impurity concentration of an N-type epitaxial layer or an N-type well region present between a P-type intrinsic base region and an $N^+$ buried layer region of the collector but lower than the impurity concentration of the N+ buried layer to control the Kirk effect to improve the cut-off frequency of the bipolar transistor.

In those methods, bipolar transistors are normally used in pairs in order to achieve high speed operation and high driving capacity of a bipolar transistor.

For example, in a process of manufacturing a bipolar transistor disclosed in JP,A, 2-215158, in the first method polycrystalline silicon worked to a small width is used as an emitter electrode to achieve reduction in magnitude of electrodes of a bipolar transistor in a transverse direction to reduce the resistance and the capacitance parasitic in the bipolar transistor itself.

Next, in the second method, Using a mask such as mask 11 as shown in FIG. 3(a), an N-type impurity region 6 is provided over the entire range just below intrinsic base region 7 and extrinsic base region 10 between $N^+$-type buried layer region 2 and intrinsic base region 7 to control a depletion layer between the base and the collector from extending to the collector side thereby to achieve improvement of the cut-off frequency fT which is one of the AC characteristics of a bipolar transistor.

Next, the process of manufacturing a bipolar transistor of the conventional structure disclosed in JP,A, 2-215158 is described with reference to the drawings. FIGS. 1 and 2 are sectional views of a semiconductor element illustrating the process of manufacturing a bipolar transistor of the conventional structure.

The process of manufacturing a bipolar transistor of the conventional structure is described below with reference to FIGS. 1 and 2.

Referring to FIG. 1, $N^+$-type buried layer region 2 and an N-type epitaxial layer are formed on P-type semiconductor substrate 1, and then the N-type epitaxial layer is changed into N-type well region 4 by ion implantation. Further, device separating oxide (insulation) film 5 is formed, and then, N-type impurity region 6 and intrinsic base region 7 are formed in desired regions by ion implantation using mask 11.

Thereafter, in FIG. 2, emitter electrode 8 is formed on the article shown in FIG. 1, and oxide film spacer 9 is formed using a known CVD (Chemical Vapour Deposition) technique and a known anisotropic etching technique, whereafter extrinsic base region 10 is formed by ion implantation.

In the bipolar transistor of the conventional structure described above, however, since an N-type impurity region is formed using mask 11 for formation of an intrinsic base region having an opening of a large area as shown in FIG. 3(a) and FIG. 3(b) which shows a cross section taken along line A—A of FIG. 3(a), N-type impurity region 6 having a concentration higher than that of N-type well region 4 is present over the overall area just below intrinsic base region 7 and extrinsic base region 10 as shown in the sectional view of FIG. 3(b). Consequently, a high capacitance occurs between the collector and the base and this is one of the causes of the slow circuit operation of the bipolar transistor.

The inventor of the present invention conducted an experiment and simulation to determine a relationship of the capacitance $C_{BC}$ between the base and the collector and the cut-off frequency fT to the distance from emitter slit 12 to N-type impurity region 6. The result of the experiment and simulation proved that, as shown in FIGS. 4 and 5, even if distance X from emitter slit 12 to N-type impurity region 6 is X>0.5 μm, the capacitance $C_{BC}$ between the base and the collector continues to increase and the cut-off frequency fT is not improved.

SUMMARY OF THE INVENTION

It is an object of the present invention to provide a semiconductor device which has a high speed operation and high driving capacity by reducing the parasitic capacitance between the base and the collector and simultaneously improving the cut-off frequency and a process of manufacturing the semiconductor device.

In accordance with the present invention, there is provided a semiconductor device, comprising an NPN bipolar transistor having an N-type impurity region formed in an N-type epitaxial region or an N-type well region between an N+-type buried layer region and a P-type intrinsic base region, the N-type impurity region being present just below the P-type intrinsic base region, the N-type impurity region having an impurity concentration lower than the impurity concentration of the N+-type buried layer region but higher than the impurity concentration of the N-type epitaxial region or N-type well region. There is provided another semiconductor device, comprising an NPN bipolar transistor having an N-type impurity region formed in an N-type epitaxial region or an N-type well region between an N+-type buried layer region and a P-type intrinsic base region, the N-type impurity region being present in first and second different concentrations just below the P-type intrinsic base region, the second N-type impurity region which is present just below an emitter diffused region having an impurity concentration higher than the impurity concentration of the first N-type impurity region which is present surrounding the second N-type impurity region.

Further, there is provided a process of manufacturing a semiconductor device including a bipolar transistor, comprising the steps of forming a first buried layer region having an impurity of a first conduction type on a semiconductor substrate, forming an epitaxial region of the first conduction type on the semiconductor substrate and doping a bipolar region in the epitaxial region into the first conduction type, and forming an N-type impurity region and an intrinsic base region in a desired region on the semiconductor substrate using a mask.

The above and other objects and features of the invention will appear more fully hereinafter from a consideration of the following description taken in connection with the accompanying drawing wherein one example is illustrated by way of example.

BRIEF DESCRIPTION OF THE DRAWINGS

FIG. 11(a) is a plan view showing openings of an implantation mask for the N-type impurity region and the intrinsic base region according to the present invention;

FIG. 11(b) is a sectional view of a semiconductor device of the present invention when the mask is provided;

DESCRIPTION OF THE PREFERRED EMBODIMENTS

A first embodiment of the present invention is described below with reference to the drawings.

FIGS. 6 to 10 are sectional views of a semiconductor device illustrating the structure and the manufacturing process of the first embodiment of the present invention. FIG. 11(a) is a plan view showing openings of an implantation mask for an intrinsic base region and an N-type impurity region, and FIG. 11(b) is a sectional view taken along line B—B of FIG. 11(a).

First, the structure of the first embodiment of the present invention is described with reference to FIGS. 7, 8, 11(a) and 11(b).

Figure 7:
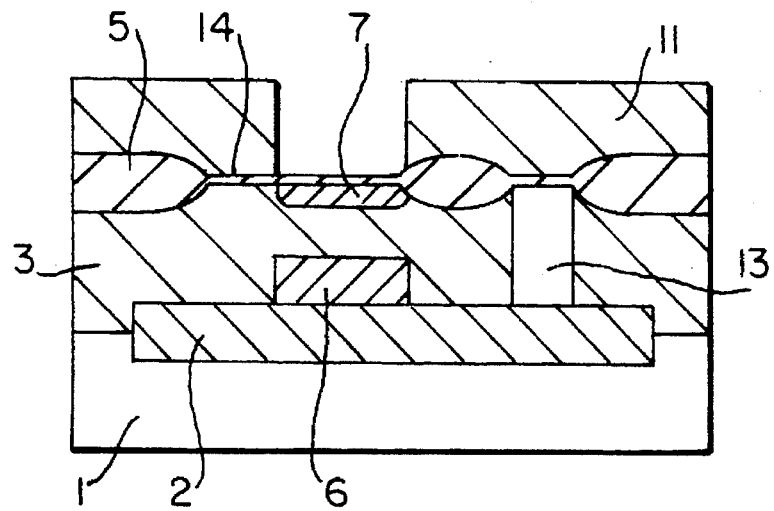
FIG. 7 is a sectional view of the semiconductor device at the step of formation of an N-type impurity region and an intrinsic base region in the first embodiment.

The structure of the first embodiment of the present invention is characterized in that, when compared with the conventional example, N-type impurity region 6 is present substantially only Just below intrinsic base region 7 as shown in FIG. 7. Due to the structure, the capacitance between the base and the collector can be reduced by approximately 30% from that of the prior art, and simultaneously, improvement in the cut-off frequency fT can be achieved.

Next, the manufacturing process of the first embodiment of the present invention is described with reference to FIGS. 6 to 10, 11(a) and 11(b).

Figure 1:
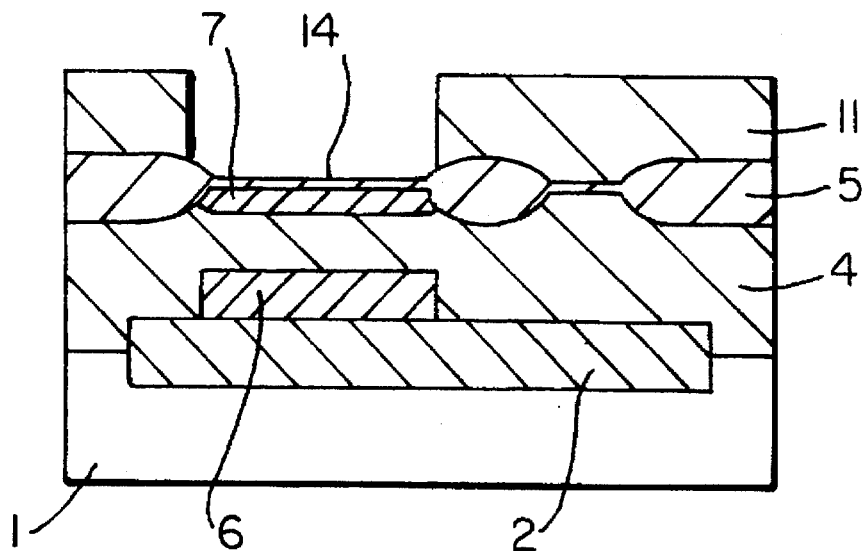
FIG. 1 is a sectional view of a semiconductor device at the step of formation of an N-type impurity region and an intrinsic base region in a conventional example.
Figure 2:
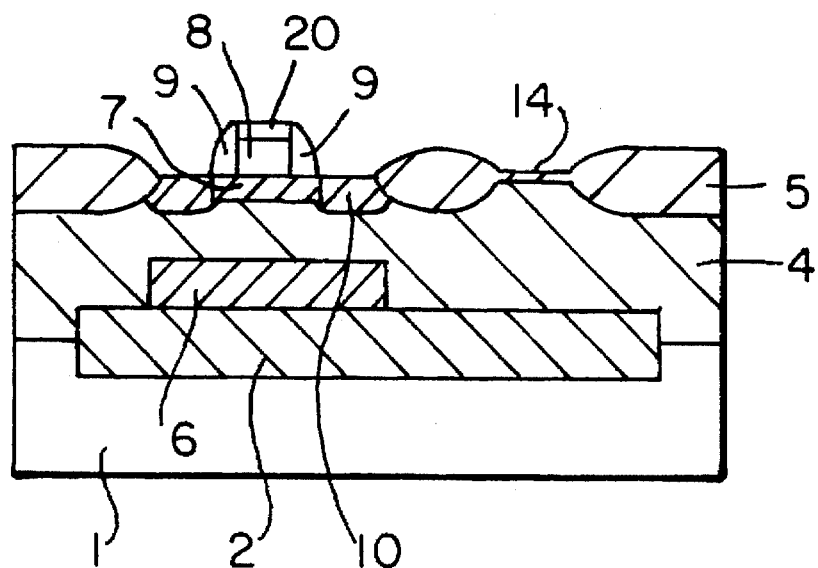
FIG. 2 is a sectional view of the semiconductor device at the step of formation of an extrinsic base region in the conventional example.
Figure 3A:
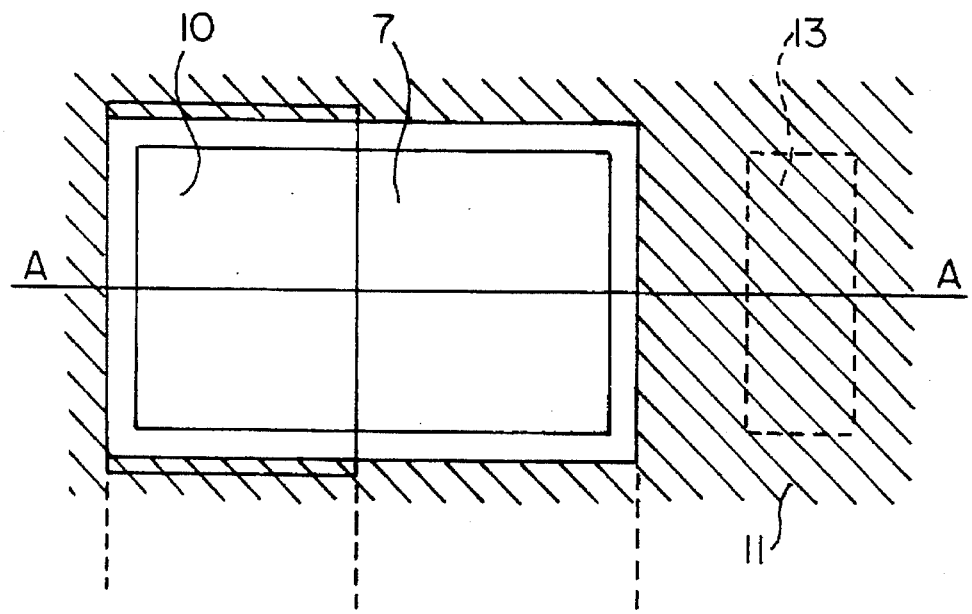
FIG. 3(a) is a plan view showing openings of an implantation mask for the N-type impurity region and the intrinsic base region in the conventional example.
Figure 3B:
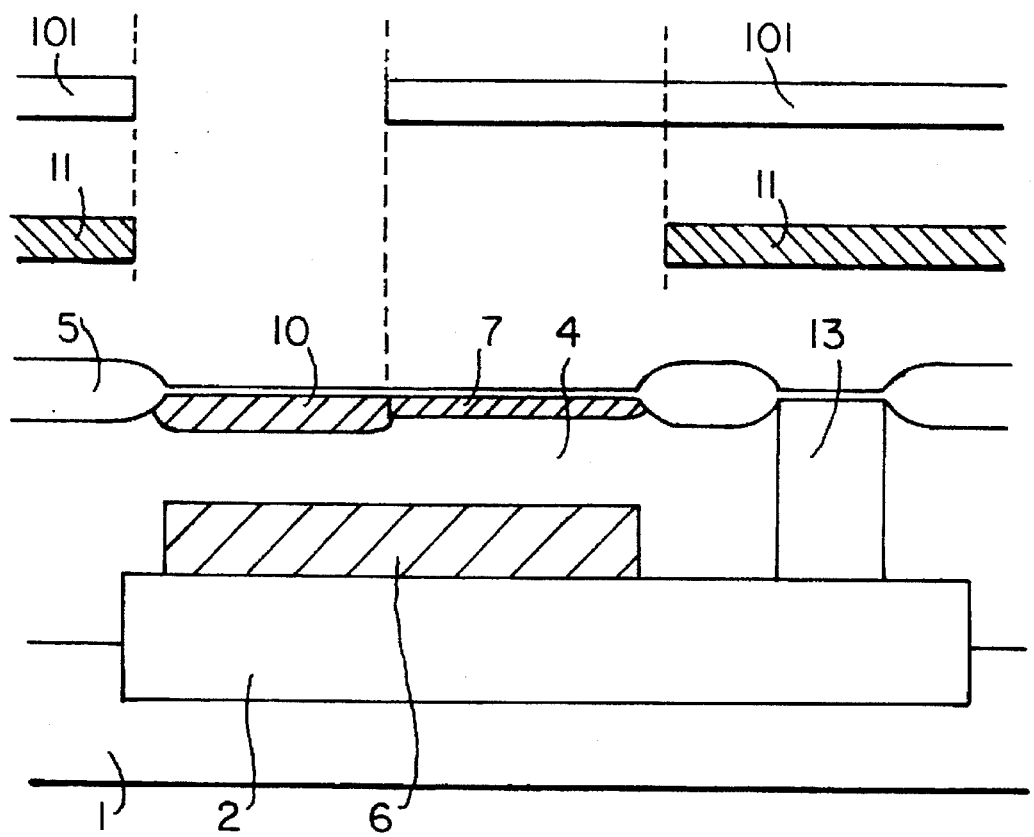
FIG. 3(b) is a sectional view of a conventional semiconductor device when the implantation mask is provided.
Figure 5:
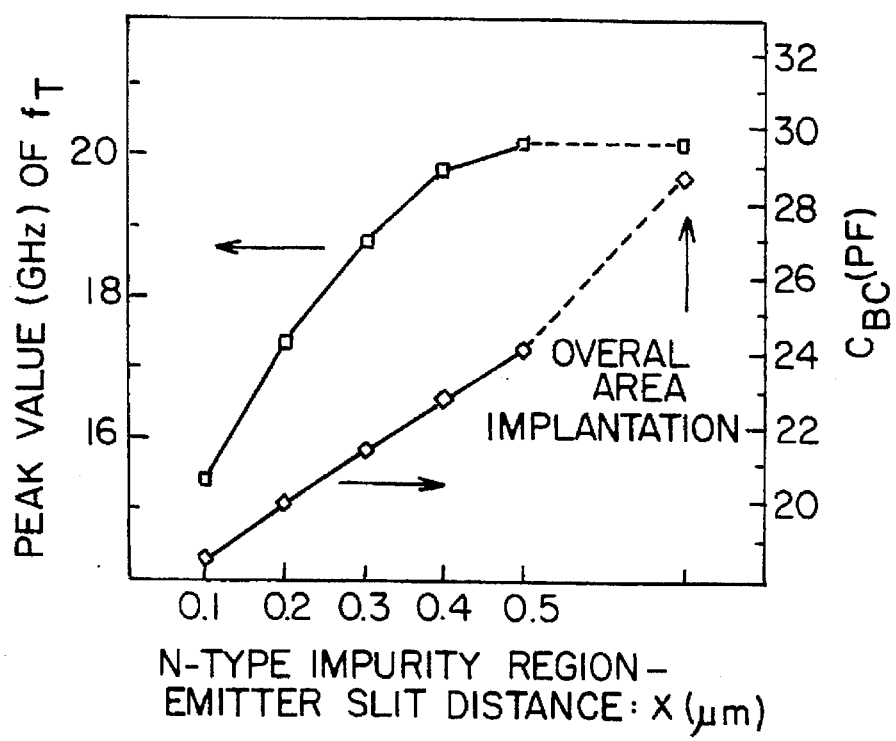
FIG. 5 is a graph illustrating the relationship of the capacitance $C_{BC}$ between the base and the collector and the cut-off frequency fT to the distance X.
Figure 4:
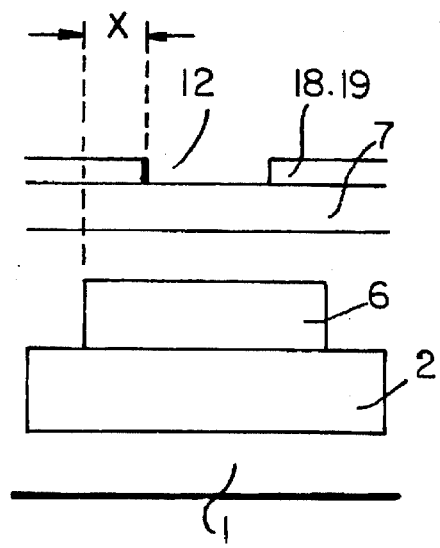
FIG. 4 is a sectional view of a conventional semiconductor device showing a distance X between an N-type impurity region and an emitter slit.
Figure 6:
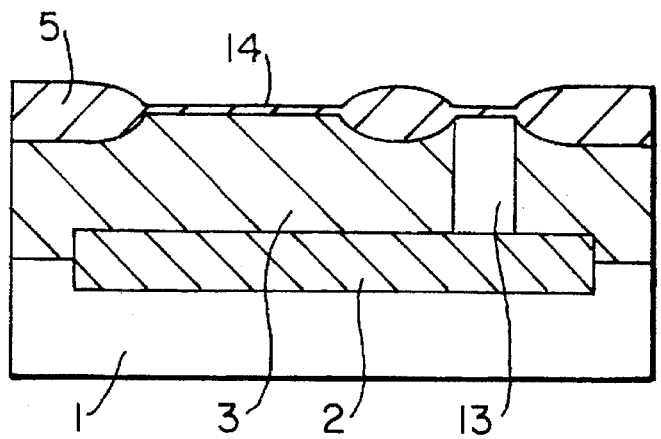
FIG. 6 is a sectional view of a semiconductor device at the step of formation of an N-type buried layer region and an N-type epitaxial layer in a first embodiment.

Referring to FIG. 6, $N^+$-type buried layer region 2 and N-type epitaxial layer 3 are formed on P-type semiconductor substrate 1, and further, device separating oxide (insulation) film 5 and collector lead region 13 are formed.

Then, in FIG. 7, using mask 11 shown in FIGS. 11(a) and 11(b), N-type impurity region 6 is formed using phosphorus preferably at 200 to 400 keV, $10^{11}$ to $10^{13}$ cm$^{-2}$ and then, using the same mask, intrinsic base region 7 is formed using boron or boron fluoride at 5 to 30 keV, $10^{12}$ to $10^{14}$ cm$^{-2}$. Alternatively, intrinsic base region 7 can be formed prior to forming N-type impurity region 6.

Figure 8:
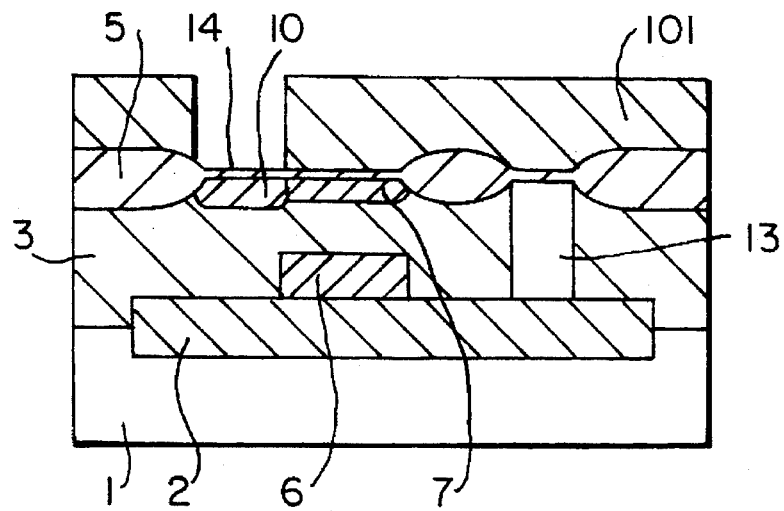
FIG. 8 is a sectional view of the semiconductor device at the step of formation of an extrinsic base region in the first embodiment.

Thereafter, in FIG. 8, using mask 101, extrinsic base region 10 is formed at 10 to 50 keV, $10^{14}$ to $10^{16}$ cm$^{-2}$ using boron or boron fluoride.

Here, masks 11 and 101 for formation of intrinsic base region 7 and extrinsic base region 10 have openings which overlap with each other as shown in FIG. 11(b), and a preferable overlap amount (Y portion shown in FIG. 11(b)) is Y=0.2 to 0.6 μm.

Figure 9:
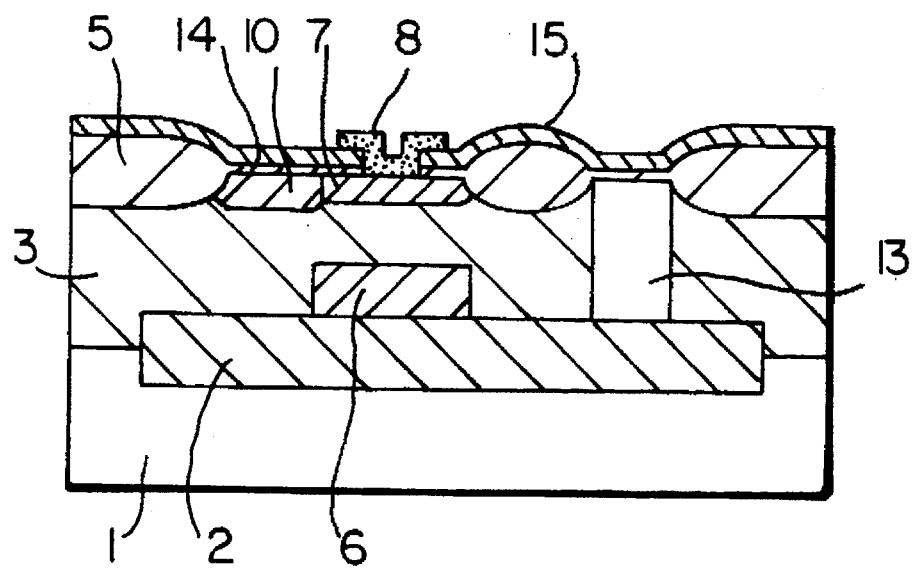
FIG. 9 is a sectional view of the semiconductor device at the step of formation of an emitter electrode in the first embodiment.

Then, in FIG. 9, second oxide film 15 is grown using a known CVD technique, and using a mask, first and second oxide films 14 and 15 are perforated by a known anisotropic etching technique to form an emitter slit. Thereafter, polycrystalline silicon of 1,000 to 3,000 angstrom thick is grown using a known CVD technique, and further, using a mask, emitter electrode 8 is formed by a known anisotropic etching technique. In this instance, doping of an impurity such as phosphorus or arsenic into the polycrystalline silicon for formation of emitter diffused region 17 may be performed using either one of a method wherein it is performed upon growth and another method wherein it is performed by ion implantation or the like after growth.

Figure 10:
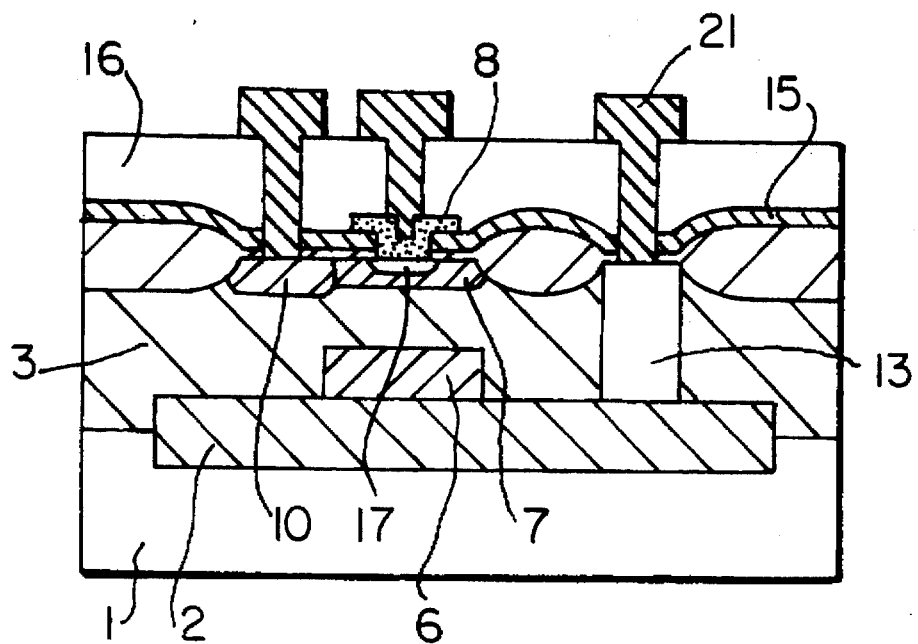
FIG. 10 is a sectional view of the semiconductor device at the step of formation of an emitter diffused region in the first embodiment.

Thereafter, in FIG. 10, third oxide film 16 is grown using a known CVD technique, and using a mask, a contact hole is perforated by a known anisotropic etching technique, whereafter wiring line 21 is formed. It is to be noted that emitter diffused region 17 is formed in intrinsic base region 7 by heat treatment in the manufacturing process.

Next, a second embodiment of the present invention is described with reference to the drawings.

FIGS. 12 to 17 are sectional views of a semiconductor device illustrating the structure and the manufacturing process of the second embodiment of the present invention.

First, the structure of the second embodiment of the present invention is described with reference to FIGS. 13 and 15.

In the semiconductor device of the structure of the first embodiment of the present invention, since formation of N-type impurity region 6 is performed by a single implantation operation, the concentration of an impurity in N-type impurity region 6 is uniform as viewed in the distribution in a transverse direction just below the base. In contrast, the structure of the second embodiment of the present invention is characterized in that, as shown in FIG. 15, an N-type impurity region is constituted from first and second different N-type impurity regions 18 and 19 and second N-type impurity region 19 is present only just below emitter diffused region 17 and has an impurity concentration higher by 20 to 30% than that of N-type impurity region 6 indicated in the first embodiment of the present invention. Further, first N-type impurity region 18 is present surrounding second N-type impurity region 19 and has an impurity concentration lower by 20 to 30% than that of N-type impurity region 6 indicated in the first embodiment of the present invention.

It has been confirmed that, by making the concentration of the N-type impurity region immediately below emitter diffused region 17 (that is, second N-type impurity region 19 in FIG. 17) higher by 20 to 30% than that of N-type impurity region 6 indicated in the first embodiment of the present invention and further by making the concentration of first N-type impurity region 18 in FIG. 17 lower by 20 to 30% than that of N-type impurity region 6 of the first embodiment of the present invention, the cut-off frequency fT can be improved higher than that of the first embodiment of the present invention. Simultaneously, the capacitance between the base and the collector was successfully reduced by 10 to 20% as compared with that of the first embodiment of the present invention.

Next, the manufacturing process of the second embodiment of the present invention is described with reference to FIGS. 11(a), 11(b) and 12 to 17.

Figure 12:
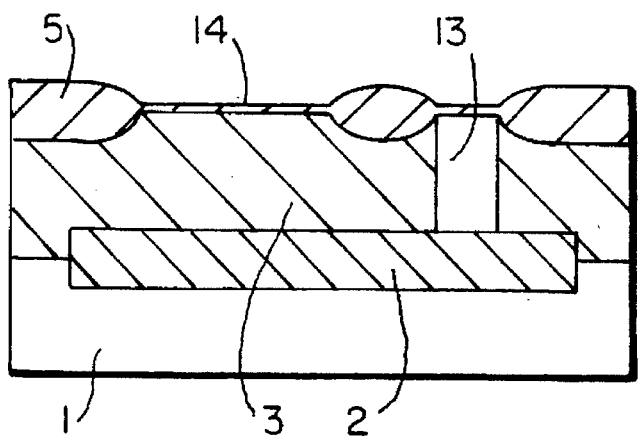
FIG. 12 is a sectional view of a semiconductor device at the step of formation of an N-type buried layer region and an N-type epitaxial layer in a second embodiment.

Referring first to FIG. 12, $N^+$-type buried layer region 2 and N-type epitaxial layer 3 are formed on P-type semiconductor substrate 1, and further, device separating oxide (insulation) film 5 and collector lead region 13 are formed.

Figure 13:
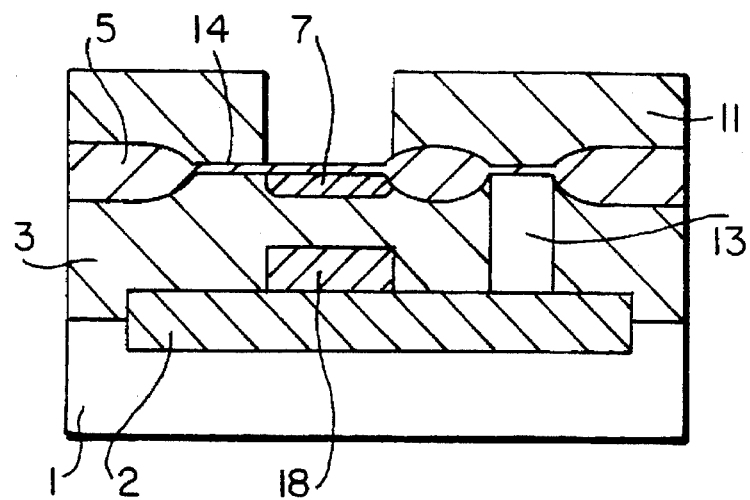
FIG. 13 is a sectional view of the semiconductor device at the step of formation of a first N-type impurity region and an intrinsic base region in the second embodiment.

Then, in FIG. 13, using mask 11 shown in FIGS. 11(a) and 11(b), first N-type impurity region 18 is formed preferably at 200 to 400 keV, $10^{11}$ to $10^{13}$ $cm^{-2}$ using phosphorus, and further, using the same mask, intrinsic base region 7 is used at 5 to 30 keV, $10^{12}$ to $10^{14}$ $cm^{-2}$ using boron or boron fluoride. Alternatively, intrinsic base region 7 can be formed prior to forming first N-type impurity region 18.

Figure 14:
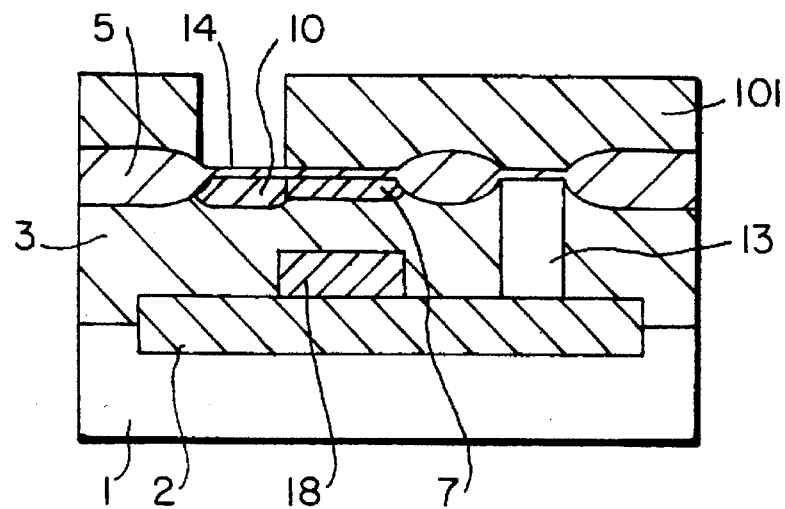
FIG. 14 is a sectional view of the semiconductor device at the step of formation of an extrinsic base region in the second embodiment.

Thereafter, in FIG. 14, using mask 101, extrinsic base region 10 is formed at 10 to 50 keV, $10^{14}$ to $10^{16}$ $cm^{-2}$ using boron or boron fluoride.

The steps described above are similar to those in the first embodiment.

Figure 15:
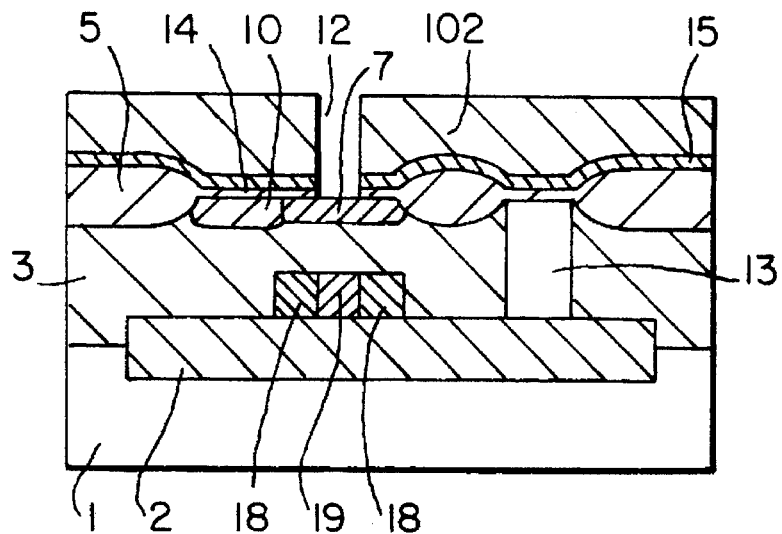
FIG. 15 is a sectional view of the semiconductor device at the step of formation of a second N-type impurity region in the second embodiment.
Figure 16:
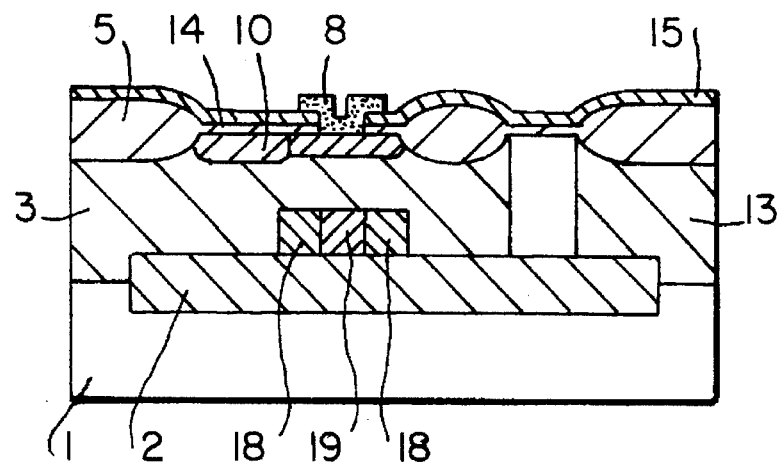
FIG. 16 is a sectional view of the semiconductor device at the step of formation of an emitter electrode in the second embodiment.

Next, in FIG. 15, second oxide film 15 is grown using a known CVD technique, and using mask 102, first and second oxide films 14 and 15 are removed by etching using a known anisotropic etching technique to form an emitter slit 12, whereafter second N-type impurity region 19 is formed at 200 to 400 keV, $10^{11}$ to $10^{13}$ $cm^{-2}$ using phosphorus. Then, polycrystalline silicon of 1,000 to 3,000 angstrom thick is grown using a known CVD technique, whereafter emitter electrode 8 is formed as shown in FIG. 16 by a known anisotropic etching technique using a mask. In this instance, doping of an impurity such as phosphorus or arsenic into the polycrystalline silicon for formation of emitter diffused region 17 may be performed by either a growth method or an ion implantation method after growth.

It is to be noted that the concentration of phosphorus in second N-type impurity region 19 depends upon the sum of the implantation amount ($10^{11}$ to $10^{13}$ $cm^{-2}$) of phosphorus into first N-type impurity region 18 in FIG. 13 and the implantation amount ($10^{11}$ to $10^{13}$ $cm^{-2}$) of phosphorus in FIG. 15.

Figure 17:
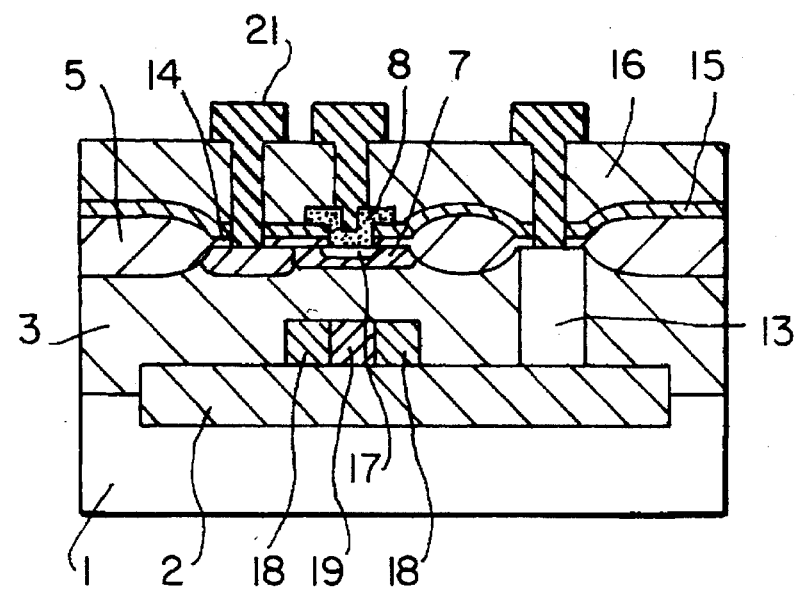
FIG. 17 is a sectional view of the semiconductor device at the step of formation of an emitter diffused region in the second embodiment.

Then, in FIG. 17, third oxide film 16 is grown using a known CVD technique, and using a mask, a contact hole is perforated by a known anisotropic etching technique, whereafter wiring line 21 is formed.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A process of manufacturing a semiconductor device including a bipolar transistor, comprising the steps of:

forming a first buried layer region having an N-type impurity on a P-type semiconductor substrate;

forming an N-type epitaxial region on the semiconductor substrate;

doping a bipolar region in the epitaxial region into the N type;

forming a P-type intrinsic region on the N-type epitaxial region using a mask; and forming an N-type impurity region between the P-type intrinsic region and the N-type buried layer using the mask, so that the N-type impurity region is separated from the P-type intrinsic region by the N-type epitaxial region, wherein the step of forming an N-type impurity region using a mask includes the steps of:

forming a first N-type impurity region using a first mask having an opening; and forming a second N-type impurity region in the center of the first N-type impurity region using a second mask having an opening different from that of the first mask, so that the second N-type impurity region has an impurity concentration higher than the impurity concentration of the first N-type impurity region.

2. A process of manufacturing a semiconductor device as claimed in claim 1, wherein the opening of the first mask and the opening of the second mask partially overlap each other.

3. A process of manufacturing a semiconductor device including a bipolar transistor, comprising the steps of:

forming a first buried layer region having an N-type impurity on a P-type semiconductor substrate;

forming an N-type epitaxial region on the semiconductor substrate;

doping a bipolar region in the epitaxial region into the N type;

forming an N-type impurity region over the N-type buried layer using a mask, wherein the step of forming an N-type impurity region using a mask includes the steps of:

forming a first N-type impurity region using a first mask having an opening; and forming a second N-type impurity region in the center of the first N-type impurity region using a second mask having an opening different from that of the first mask, so that the second N-type impurity region has an impurity concentration higher than the impurity concentration of the first N-type impurity region; and forming a P-type intrinsic region on the N-type epitaxial region over the N-type impurity region using the mask, so that the N-type impurity region is separated from the P-type intrinsic region by the N-type epitaxial region.

4. A process of manufacturing a semiconductor device as claimed in claim 3, wherein the opening of the first mask and the opening of the second mask partially overlap each other.

* * * * *